United States Patent [19]

Beaumont et al.

[11] 4,289,994
[45] Sep. 15, 1981

[54] VERTICAL DRIVE CIRCUIT FOR VIDEO DISPLAY

[75] Inventors: Gregory J. Beaumont, Arlington Heights; Lloyd E. Matthews, Berwyn, both of Ill.

[73] Assignee: Zenith Radio Corporation, Glenview, Ill.

[21] Appl. No.: 77,432

[22] Filed: Sep. 20, 1979

[51] Int. Cl.³ .............................................. H01J 29/70
[52] U.S. Cl. .................................. 315/371; 315/389; 315/397
[58] Field of Search .................. 315/389, 397, 371

[56] References Cited

U.S. PATENT DOCUMENTS

| | | | |
|---|---|---|---|
| 3,426,245 | 2/1969 | Yurasek et al. | 315/389 |
| 3,842,311 | 10/1974 | Knox | 315/388 |
| 3,965,390 | 6/1976 | Spencer, Jr. | 315/397 |
| 3,983,452 | 9/1976 | Bazin | 315/397 |
| 3,991,345 | 11/1976 | Jaspers | 315/388 |
| 4,052,645 | 10/1977 | Fujita | 315/397 X |
| 4,184,105 | 1/1980 | Skelton | 315/397 |
| 4,203,056 | 5/1980 | Itoh | 315/397 X |

*Primary Examiner*—Malcolm F. Hubler
*Attorney, Agent, or Firm*—Thomas E. Hill

[57] ABSTRACT

Disclosed is a vertical drive circuit for a cathode ray tube in a video display in which sawtooth current waveform corrections for the deflection yoke are made by means of an S-correction feedback loop featuring DC-coupling and low frequency filtering. The amplified correction signal is transmitted to a push-pull type output stage for driving the deflection yoke. Power consumption is reduced and operation made more efficient by an approximate doubling of the retrace voltage applied to the push-pull output stage during retrace by means of a discharging capacitor network.

4 Claims, 1 Drawing Figure

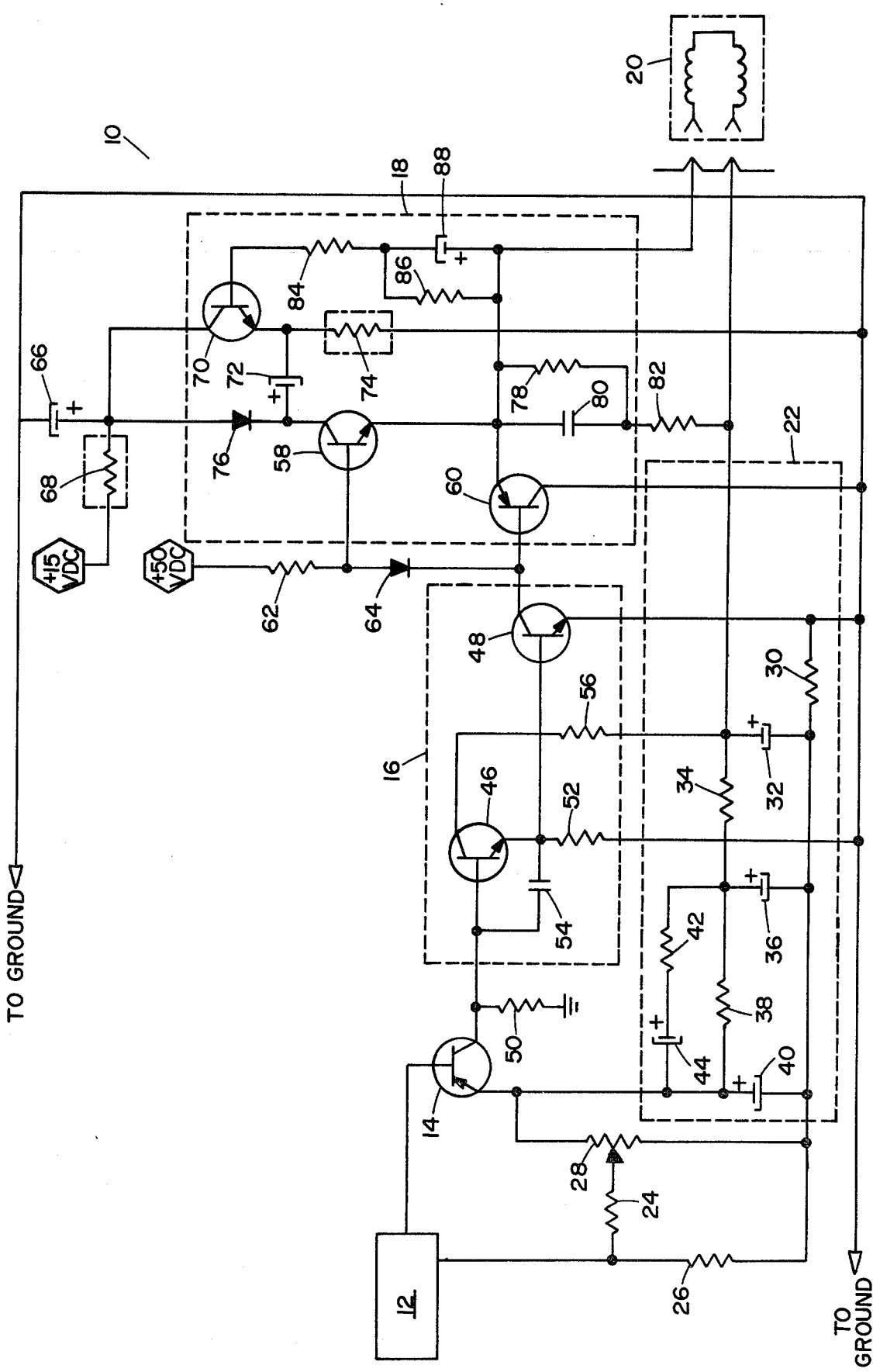

VERTICAL DRIVE CIRCUIT FOR VIDEO DISPLAY

CROSS REFERENCE TO RELATED APPLICATIONS

This application is related to, but in no way dependent on, the following application which is assigned to the assignee of the present application: Ser. No. 077,434 filed Sept. 20, 1979, entitled "SELF-OSCILLATING SAWTOOTH CURRENT DEFLECTION GENERATOR" in the name of Lloyd E. Matthews, now U.S. Pat. No. 4,234,828.

BACKGROUND OF THE INVENTION

This invention relates in general to vertical deflection drive circuitry in the cathode ray tube of a video display and in particular to a push-pull type yoke current deflection system with an S-correction feedback control loop for generating a more accurate sawtooth deflection waveform.

An image is displayed on the face of a cathode ray tube (CRT) is repeatedly scanning an electron beam across the face of the CRT both in horizontal and vertical directions. The sweep is caused by the application of sawtooth current waveforms to deflection windings in the CRT. If a linear sawtooth waveform is applied to the deflection winding, display distortions appear on the face of the CRT. These distortions are caused by the electron beam striking a flat surface such that equal increments of beam deflection do not intersect equal areas on the face of the CRT. This phenomena is referred to as the flat face effect and is corrected for by means of the so-called S-correction factor which operates to compress the beginning of the sawtooth current waveform and the end of the sawtooth waveform to give the appearance of an S. Various attempts to eliminate the aforementioned sources of video presentation distortion are documented in the prior. See U.S. Pat. No. 3,842,311 and 3,991,345.

Another source of nonlinearity in electron beam deflection is the deflection coil itself. Because of the high inductance and relatively low resistance characteristic of electromagnetic deflection coils, the voltage applied across the coil is different than the current transmitted through the coil. This situation creates nonlinear current fluctuations in the deflection coil due to these large inductances. Finally, amplifier instabilities, or instabilities in transistor gain, in the deflection circuit cause nonlinearities in the sawtooth current waveform used to drive the deflection coil.

The present invention eliminates the nonlinear effects of the aforementioned drive circuit characteristics. The result is a DC-coupled, direct drive vertical deflection system in which an input sawtooth current waveform is directly coupled to the vertical deflection yoke. The present invention represents an inexpensive, efficient and energy saving approach to electron beam deflection in a CRT.

OBJECTS OF THE INVENTION

Accordingly, it is an object of the present invention to provide an improved vertical deflection system for a cathode ray tube in a video display.

It is another object of the present invention to provide a vertical deflection system in a cathode ray tube for generating a more accurate sawtooth current waveform in a DC-coupled yoke deflection configuration utilizing an S-correction feedback loop.

It is still another object of the present invention to provide a more efficient vertical deflection system by reducing electron beam retrace time.

BRIEF DESCRIPTION OF THE DRAWING

The appended claims set forth those novel features believed characteristic of the invention. However, the invention itself, as well as further objects and advantages thereof, will best be understood by reference to the following detailed description of a preferred embodiment taken in conjunction with the accompanying drawing, in which is shown a circuit diagram of a vertical drive deflection circuit for a cathode ray tube in a video display in accordance with the preferred embodiment of the present invention.

DESCRIPTION OF THE PREFERRED EMBODIMENT

Referring to the circuit diagram of the FIGURE, there is shown a vertical drive circuit 10 in accordance with the preferred embodiment of the present invention. The primary components of this system are the sawtooth current waveform generator 12, a differential amplifier 14, the amplifier stage 16, the output stage 18, the deflection yoke 20 and the S-correction feedback loop 22.

Since the present invention finds particular utility in the vertical deflection circuit of a CRT in a video display, it will be particularly described with reference to its use in such apparatus, although it will be appreciated that its uses are by no means limited to such applications.

In accordance with the preferred embodiment of the present invention, current generated in a sawtooth current waveform generator 12 is provided to the base of transistor 14. The sawtooth waveform generator 12 is typically a capacitor discharge network for generating the required sawtooth current waveform. The sawtooth current waveform is also transmitted to the emitter of transistor 14 through vertical size resistors 24, 26 and 28. The vertical size of the video presentation may be varied by means of potentiometer 28. These vertical size resistors function primarily as a discharge path for the sawtooth capacitor (not shown) in the sawtooth current waveform generator 12. These discharge resistors determine the discharge slope and, in combination with the synchronization input signals, the peak-to-peak voltage level of the sawtooth waveform.

Also imposed on the emitter of transistor 14 is the yoke feedback current which is transmitted from the yoke 20 through the S-correction feedback control loop 22. Resistor 30 acts as a current sensing resistor in that the voltage across resistor 30 is exactly proportional to the yoke current. With a sawtooth current imposed on the yoke 20, the signal level at resistor 30 is fed back to the emitter of transistor 14, the base of which has imposed on it the sawtooth waveform of the sawtooth current waveform generator 12. Voltage differences between the two signals imposed on the base and emitter of transistor 14 results in the flow of current from the collector of transistor 14 into the vertical amplifier stage 16 which corrects current flow into the yoke 20 to make it conform with the sawtooth generated by the sawtooth current waveform generator 12. Transistor 14 thus performs the function of a differential amplifier in that it compares two sawtooth current inputs and generates a difference signal for later amplification in correcting the sawtooth current waveform delivered to the deflection yoke 20.

S-correction to account for the planar configuration of the CRT's screen is accomplished in the S-correction feedback loop 22. This is accomplished by the several RC-networks in the feedback control loop 22. The S-correction is performed by means of the circuit across capacitor 32 and involves the double integration of the parabolic correction waveform. Two RC-networks comprised of resistor 34 and capacitor 36 and resistor 38 and capacitor 40, respectively, not only integrate the S-correction factor in the yoke current feedback waveform but also, by means of double integration, remove the S-correction factor from the feedback signal so that a linear sawtooth feedback signal may be compared with a linear sawtooth input signal to the base of transistor 14. This process removes sawtooth wave distortions due to S-corrections and results in the generation of a more accurate sawtooth correction signal. Thus, by coupling an integrated portion of the S-correction parabola which imposes an S-correction on the signal across resistor 30, the output of these RC networks has the S-correction factor removed so as to provide a linear sawtooth waveform at the emitter of transistor 14. This is accomplished by double integration of the S-correction waveform resulting in the generation of an inverse S-correction waveform imposed on the yoke current feedback signal. This is done by adding to the voltage across resistor 30 a 60 Hz sign wave input generated by these RC-networks which straightens out the S-corrected yoke feedback current waveform. Resistor 42 and capacitor 44 form an RC-network for DC-coupling the yoke current feedback signal to transistor 14 and the follow-on amplifier stages. This RC-network permits the establishment of the proper DC level at the emitter of transistor 14.

Capacitor 44 and resistor 38, in addition, act as a low frequency filter network in eliminating sources of low frequency oscillation in the vertical drive circuit 10. While resistors 42 and 34 function primarily as shaping resistors in forming the sawtooth current feedback signal, resistor 38 is primarily involved in the DC-coupling aspects of the feedback circuit and does not function as a waveform shaping resistor. Capacitor 32 is a large electrolytic capacitor in series with the yoke 20 which passes the yoke current and provides DC isolation for the output stage 18 and the deflection yoke 20.

Transistor 14 acts as a differential amplifier in comparing the inverse of the S-correction signal input on the emitter with a perfectly linear sawtooth current waveform produced by the sawtooth current waveform generator 12 and input on the base of transistor 14. The collector output of transistor 14 is the difference signal between these two sawtooth current waveform inputs which is delivered to the base of transistor 46. Transistor 46 functions as an emitter-follower amplifier and in combination with vertical driver transistor 48 forms the amplifier stage 16 of the vertical drive circuit 10. Loading resistors are needed so that transistors 46 and 48 are cut off during retrace. Resistor 50 performs a bleed-off resistor function for transistor 46 while resistor 52 performs the same function for transistor 48. These resistors bleed-off current from the base of these transistors so as to bring about a more complete and rapid transistor shut-off during the retrace period. Because of the high gain present therein, the vertical drive circuit 10 is prone to oscillate at high frequencies. In order to filter out oscillation-producing high frequencies, capacitor 54 is incorporated to eliminate the high frequency response of the circuit. Transistor 48, the vertical driver, acts primarily as a voltage amplifier in providing a sawtooth voltage waveform to the output stage 18. Resistor 56 is incorporated to protect against arcs on the deflection yoke 20 which might be fed back and lead to the breakdown of transistor 46.

The output of transistor 48 is transmitted to transistors 58 and 60 which, in combination, form a push-pull amplifier stage for generating an alternating deflection current in the yoke 20. Transistor 58 conducts when there is a +50 volt DC input through resistor 62, until transistor 48 draws sufficient current down through resistor 62 so as to cut off current into the base of transistor 58. Transistor 48 then begins pulling current out of the base of transistor 60 which is then turned on. Transistor 60 continues to conduct until the end of trace when the voltage on transistor 48 is reduced to within a few volts of ground reference potential at which point transistor 48 ceases to conduct and retrace, or flyback, is initiated. Transistor 58 thus conducts during the first half of trace while transistor 60 conducts during the last half of trace. This results in a push-pull type effect with current running alternately in both directions in the deflection yoke 20. In effect, the output of transistor 48 drives transistors 58 and 60 alternately depending upon the current requirements of the deflection yoke 20. During retrace transistor 48 shuts off so that the voltage on the bases of transistors 58 and 60 rapidly increases resulting in the turn on of transistor 58 which again initiates the trace cycle. Resistor 62 provides the necessary current bias into the bases of transistors 58 and 60 to insure their turn on at the proper time and voltage level. Diode 64 regulates current flow between transistors 58 and 60 and prevents both output transistors from being turned on at the same time. With 0.6 volts across each of the emitter-base junctions of transistors 58 and 60, two offset voltages are established across the output stage 18. By incorporating sufficient gain in the vertical drive circuit 10, only one diode need be incorporated between transistors 58 and 60. This high gain permits a smooth transition between the alternately conducting transistors in jumping the voltage gap created by these two offset voltages. By incorporating a sufficiently high feedback gain in the vertical drive circuit 10 a smooth current transition is realized without the presence of a notch, or discontinuity, in the center of the video presentation appearing at 0 current. In this manner a smooth transition is made from transistor 58, which conducts during the first half of trace, to transistor 60, which conducts during the last half of trace.

Two B+ voltages are provided to the video display in the present invention. The +15 volt DC source feeds a large current to the output transistors. The +50 volts DC source produces a constant current bias on the output stages of the vertical drive circuit 10 because of the availability of a constant current at this high voltage. When transistor 58 begins to conduct, the sawtooth current waveform starts downward. At this point the B+ voltage need not be maintained fixed at +15 volts DC but can be permitted to drift downward. The combination of capacitor 66 and resistor 68 permits the +15 volts DC to drift downward when transistor 58 begins to conduct. This reduces the voltage across transistor 58 during high current conduction thus resulting not only in a reduction in power but also an increase in the lifetime of transistor 58.

Transistor 70 is the retrace control transistor and in combination with capacitor 72 and resistor 74 permits the retrace voltage to be doubled thus expediting retrace and resulting in a reduction in power consumption. Resistor 74 permits capacitor 72 to be recharged down to ground during trace so that when retrace begins and transistor 70 is turned on, transistor 70 boosts up a fully charged capacitor 72 which results in a doubling of the voltage on the collector of transistor 58. In the preferred embodiment of the present invention, this effect results in a doubling of the B+ voltage on the collector of transistor 58 from +15 volts DC to approximately +30 volts DC. This increased voltage on transistor 58 greatly expedites retrace and the re-initiation of trace. With B+ voltage applied at the collector of transistor 70, when transistor 70 is turned on and the emitter of transistor is also brought up to B+ voltage, the positive terminal of capacitor 72 reaches approximately twice the value of the B+ voltage. The voltage applied to the collector of transistor 58 is approximately 30 volts DC because of voltage drops due to diode 76 and transistor 70. This results in approximately +30 volts DC being applied to the collector of transistor 58 at the beginning of retrace period. Diode 76 permits the B+ voltage source to be disconnected temporarily from the vertical drive circuit 10 so that during retrace the collector of transistor 58 can be boosted up by transistor 70 and capacitor 72. Capacitor 72 is charged during retrace through resistor 74 because transistor 70 is off during this period. The current for charging capacitor 72 originates in the +15 volt DC power supply and is transmitted through diode 76. When trace is initiated by the circuit, the voltage in the deflection yoke 20 significantly increases because of the stored energy in the yoke. As the yoke voltage increases transistor 70 is turned on. The voltage delivered to the collector of transistor 58 when fully charged capacitor 72 discharges is supplemented by the voltage generated by transistor 70 which has been turned on by the deflection yoke. This increased voltage applied to the collector of transistor 58 results in a faster retrace and corresponding reduction in power consumption.

With transistor 58 pushing current and transistor 60 pulling current, a large alternating current is established in deflection yoke 20. Resistor 78 performs a damping function in critically damping the deflection yoke 20 so that at the end of retrace a ripple in current does not appear. This eliminates ringing in the vertical drive circuit. Capacitor 80 and resistor 82 in combination form a high frequency bypass across the deflection yoke 20 which prevents high frequency oscillations in the yoke. Resistors 84 and 86 and capacitor 88 provide the signal delivered to the base of transistor 70. Capacitor 88 acts as a coupling capacitor because of the voltage difference between the deflection yoke 20 and transistor 70. Resistor 84 performs a current limiting function and, in combination with capacitor 88 forms a timing network which controls the turn on of transistor 70 during retrace. Capacitor 88 is charged during retrace and discharges during scan, or trace. The discharge of capacitor 88 is accomplished through resistor 86. Because capacitor 88 has a much longer discharge period than charge period resistor 86 is much larger than resistor 84. When capacitor 88 discharges increased current is transmitted to the base of transistor 70 which accomplishes the aforementioned boost in the voltage applied to the collector of transistor 58 during retrace period. The combination of resistors 84 and 86 and capacitor 88 also provide the necessary biasing for the base of transistor 70 to achieve this voltage boost during retrace.

By way of illustrative example and not by way of limitation, the following components of the preferred embodiment of the present invention may have the following values:

| Reference No. | Preferred Value |
| --- | --- |
| 24 | 820 kilohms |
| 26 | 1.5 megohms |
| 28 | 250 kilohms |
| 30 | 2.7 ohms |
| 32 | 1000 microfarads |
| 34 | 1 kilohm |
| 36 | 1 microfarad |
| 38 | 39 kilohms |
| 40 | 4.7 microfarads |
| 42 | 27 kilohms |
| 44 | 1 microfarad |
| 50 | 120 kilohms |
| 52 | 15 kilohms |
| 54 | 220 picofarads |
| 56 | 1.8 kilohms |
| 62 | 5.6 kilohms |
| 66 | 100 microfarads |
| 68 | 33 ohms |
| 72 | 47 microfarads |
| 74 | 220 ohms |
| 78 | 1.1 kilohms |
| 80 | 0.012 microfarads |
| 82 | 68 ohms |
| 84 | 75 ohms |
| 86 | 3.3 kilohms |
| 88 | 10 microfarads |

There has thus been provided a vertical drive circuit for a cathode ray tube in a video display incorporating a deflection yoke sawtooth current waveform feedback correction loop with S-correction. In addition, reduced power consumption is achieved by a doubling of retrace voltage resulting in a substantially reduced retrace period.

In addition, while particular embodiments of the present invention have been shown and described, it will be obvious to those skilled in the art that changes and modifications may be made without departing from the invention in its broader aspects and, therefore, the aim in the appended claims is to cover all such changes and modifications as fall within the true spirit and scope of the invention.

We claim:
1. In a video display having a cathode ray tube energized by a first DC voltage source providing a first DC voltage level, with a vertical deflection yoke for sweeping an image across the screen of said cathode ray tube in a vertical direction by applying an input sawtooth current waveform including trace and retrace periods to said vertical deflection yoke, said input sawtooth current waveform including an S-shaped correction factor to compensate for the planar configuration of the face of said cathode ray tube, a DC-coupled vertical deflection drive circuit comprising:
 means for generating a substantially linear, input sawtooth-shaped signal;
 single signal feedback means responsive to deflection yoke current for removing said S-shaped correction factor from said sawtooth current waveform so as to generate a substantially linear, uncorrected sawtooth current waveform;
 signal level comparator means coupled to said input sawtooth-shaped signal generating means and to said signal feedback means for generating a correction signal, the magnitude of said correction signal being determined by the difference between said input sawtooth-shaped signal and said uncorrected, feedback sawtooth current waveform;

amplification means coupled to said first DC voltage source for amplifying said yoke deflection correction signal;

push-pull conducting means coupled to said amplification means for driving said deflection yoke with said yoke deflection correction signal, said push-pull conducting means connected to a second DC voltage source providing a second DC voltage level, said second DC voltage level being greater than said first DC voltage level; and means for substantially increasing the voltage applied to said push-pull conducting means during electron beam retrace so as to shorten the retrace period.

2. A vertical deflection drive circuit according to claim 1 wherein said signal feedback means comprises a current-sensing resistor in combination with capacitor means and a plurality of RC-networks for generating an inverse S-shaped signal correction factor in said feedback signal thereby producing a substantially linear, uncorrected sawtooth current waveform.

3. A vertical deflection drive circuit according to claim 2 wherein said signal feedback means further comprises a plurality of low frequency filtering networks for eliminating low frequency deflection system oscillations thereby permitting DC-coupling in said vertical deflection drive circuit.

4. A vertical deflection drive circuit according to claim 1 wherein said means for increasing said retrace voltage comprises a capacitor and transistor combination coupled to said first DC voltage source and to said push-pull conducting means such that upon transistor turn-on by means of a second deflection yoke feedback signal, said capacitor rises to said first DC voltage level causing said push-pull conducting means to be raised to twice the voltage level of said first DC voltage source thereby expediting electron beam retrace.

* * * * *